US012127446B2

(12) United States Patent
Cho et al.

(10) Patent No.: US 12,127,446 B2
(45) Date of Patent: Oct. 22, 2024

(54) DISPLAY DEVICE

(71) Applicant: LG Display Co., Ltd., Seoul (KR)

(72) Inventors: SeongPil Cho, Goyang-si (KR);
JunSeuk Lee, Seoul (KR); YongBin Kang, Gumi-si (KR); HeeJin Jung, Daegu (KR); Jangdae Kim, Daegu (KR); Dongyup Kim, Gimpo-si (KR); WonHo Son, Busan (KR); Chanho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 412 days.

(21) Appl. No.: 17/538,465

(22) Filed: Nov. 30, 2021

(65) Prior Publication Data
US 2022/0208911 A1 Jun. 30, 2022

(30) Foreign Application Priority Data
Dec. 31, 2020 (KR) .................. 10-2020-0188972

(51) Int. Cl.
*H10K 59/123* (2023.01)
*H01L 27/12* (2006.01)
(Continued)

(52) U.S. Cl.
CPC ....... *H10K 59/123* (2023.02); *H10K 59/1213* (2023.02); *H10K 59/124* (2023.02);
(Continued)

(58) Field of Classification Search
CPC ............. H10K 59/123; H10K 59/1213; H10K 59/124; H10K 59/126; H10K 59/12;
(Continued)

(56) References Cited

U.S. PATENT DOCUMENTS 8,304,300 B2    11/2012   Sakata et al.
9,176,353 B2    11/2015   Yamazaki et al.
(Continued)

FOREIGN PATENT DOCUMENTS

KR    10-2018-0074260 A         7/2018
KR         2018074260 A    *    7/2018    ......... H01L 27/1218
(Continued)

OTHER PUBLICATIONS

Zhao, et al., "The Effect of Light-shield Metal Layer on the IV Performance of the P-type LTPS TFT", 2018, SID 2018 Digest, p. 1209-1211. (Year: 2018).*
(Continued)

*Primary Examiner* — Evren Seven
*Assistant Examiner* — Sarah L Ell
(74) *Attorney, Agent, or Firm* — Fenwick & West LLP (57) ABSTRACT

A display device includes a substrate including a plurality of sub-pixels, a first buffer layer on the substrate, an etch stopper on the first buffer layer, a second buffer layer covering the first buffer layer, and a first transistor on the second buffer layer. The first transistor includes a source electrode and a drain electrode overlapping the etch stopper. The etch stopper includes a hole in which at least one of the source electrode and the drain electrode is disposed. The etch stopper is spaced apart from the source electrode and the drain electrode. Therefore, it is possible to prevent moisture and impurities from penetrating into a display device by protecting a buffer layer.

19 Claims, 4 Drawing Sheets

(51) Int. Cl.
  *H01L 29/417* (2006.01)
  *H01L 29/786* (2006.01)
  *H10K 59/121* (2023.01)
  *H10K 59/124* (2023.01)

(52) U.S. Cl.
  CPC .... *H01L 27/1225* (2013.01); *H01L 29/41733* (2013.01); *H01L 29/78675* (2013.01); *H01L 29/7869* (2013.01)

(58) Field of Classification Search
  CPC ............ H01L 27/1225; H01L 27/124; H01L 27/1248; H01L 27/1218; H01L 29/41733; H01L 29/78675; H01L 29/7869
  See application file for complete search history.

(56) References Cited

U.S. PATENT DOCUMENTS

| | | | | |
|---|---|---|---|---|
| 2007/0155157 | A1* | 7/2007 | Chou | H01L 21/76829 438/618 |
| 2009/0002591 | A1 | 1/2009 | Yamazaki et al. | |
| 2011/0003418 | A1 | 1/2011 | Sakata et al. | |
| 2013/0321733 | A1* | 12/2013 | Yamaguchi | G02F 1/136227 257/43 |
| 2014/0231764 | A1* | 8/2014 | Park | H10K 59/131 438/23 |
| 2015/0102317 | A1* | 4/2015 | Kim | H01L 29/66969 438/22 |
| 2016/0343737 | A1* | 11/2016 | Zhang | H01L 29/78663 |
| 2019/0006521 | A1* | 1/2019 | Noh | H01L 27/1262 |
| 2019/0066585 | A1* | 2/2019 | Han | H10K 59/1213 |
| 2019/0189720 | A1* | 6/2019 | Lim | H01L 27/1248 |

FOREIGN PATENT DOCUMENTS

| | | |
|---|---|---|
| TW | 201512754 A | 4/2015 |
| TW | 201624575 A | 7/2016 |

OTHER PUBLICATIONS

Extended European Search Report, European Patent Office Application No. 21211286.6, May 24, 2022, 7 pages.

Taiwan Intellectual Property Office, Office Action, TW Patent Application No. 110148602, Dec. 6, 2022, six pages.

* cited by examiner

DISPLAY DEVICE

CROSS-REFERENCE TO RELATED APPLICATIONS

This application claims the priority benefit of Republic of Korea Patent Application No. 10-2020-0188972 filed on Dec. 31, 2020, which is incorporated by reference in its entirety.

BACKGROUND

Technical Field

The present disclosure relates to a display device, and more particularly, to a display device capable of protecting a buffer layer.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Specific examples of such display devices include liquid crystal display devices (LCD), and electroluminescence display devices such as an organic light emitting display device (OLED) and a quantum dot light emitting display device (QLED). In particular, an electroluminescent display device is a next-generation display device having self-luminous characteristics, and has superior characteristics in terms of a viewing angle, contrast, response speed, power consumption, and the like, compared to a liquid crystal display device.

The electroluminescent display device includes a display area for displaying an image and a non-display area disposed adjacent to the display area. In addition, a pixel area includes a pixel circuit and light emitting elements. A plurality of thin film transistors are positioned in the pixel circuit to drive the light emitting elements disposed in a plurality of pixels.

Thin film transistors may be classified according to materials constituting a semiconductor layer. Among them, a low temperature poly-silicon (LTPS) thin film transistor and an oxide semiconductor thin film transistor are most widely used. In addition, technology development of electroluminescent display devices in which a low-temperature poly-silicon thin film transistor and an oxide semiconductor thin film transistor are formed on the same substrate is being actively developed.

SUMMARY

A display device includes a passivation layer formed under a transistor in order to prevent an active layer of the transistor from being damaged. In this case, since the passivation layer is formed of a metallic material, parasitic capacitance may be formed in the passivation layer due to a peripheral configuration of the passivation layer.

A structure for electrically connecting a source electrode or a drain electrode of a transistor is disposed on a passivation layer. Accordingly, variations in parasitic capacitance generated in the passivation layer may be minimized or reduced and reliability of the transistor may be improved. In addition, a structure in which contact holes are formed up to a passivation layer at a same time as forming the contact holes for contacting a source electrode and a drain electrode and an active layer. Accordingly, the number of masks can be reduced and the source electrode or the drain electrode can be in contact with the passivation layer.

However, a buffer layer may be damaged as etching is performed up to the buffer layer under the passivation layer in an etching process for forming the contact holes. Accordingly, a display device may be formed to be capable of preventing or at least reduce damage to a buffer layer when forming a contact hole.

An object of the present disclosure is to provide a display device capable of protecting a buffer layer under an etch stopper in forming contact holes by disposing the etch stopper to overlap a source electrode and a drain electrode.

Another object of the present disclosure is to provide a display device capable of reducing generation of unnecessary noise by allowing an etch stopper to be spaced apart from a source electrode and a drain electrode.

Objects of the present disclosure are not limited to the above-mentioned objects, and other objects, which are not mentioned above, can be clearly understood by those skilled in the art from the following descriptions.

In one embodiment, a display device includes: a substrate including a plurality of sub-pixels; a first buffer layer on the substrate; an etch stopper on the first buffer layer; a second buffer layer covering the first buffer layer; a first transistor on the second buffer layer, the first transistor including a source electrode and a drain electrode overlapping the etch stopper; and a light emitting element on the first transistor. The etch stopper may include a hole in which at least one of the source electrode and the drain electrode is disposed. The etch stopper may be spaced apart from the at least one of source electrode and the drain electrode.

In one embodiment, a display device includes: a substrate including a plurality of sub-pixels; a multi-buffer layer on the substrate; an etch stopper on the multi-buffer layer, the etch stopper configured to prevent etching of the multi-buffer layer; an active buffer layer covering the multi-buffer layer; a low temperature poly-silicon (LTPS) thin film transistor on the active buffer layer, and the LTPS thin film transistor including an active layer, a source electrode, and a drain electrode, the source electrode and the drain electrode connected to the active layer; and a light emitting element on the LTPS thin film transistor. The source electrode and the drain electrode may be disposed to overlap the etch stopper. At least one of the source electrode and the drain electrode may be disposed to contact an upper surface of the multi-buffer layer and to be spaced apart from the etch stopper.

Other detailed matters of the exemplary embodiments are included in the detailed description and the drawings.

According to the present disclosure, a buffer layer under an etch stopper is protected through the etch stopper during a contact hole etching process, so that it is possible to prevent moisture and impurities from penetrating into a display device.

According to the present disclosure, since an etch stopper and a source electrode or a drain electrode are electrically insulated, malfunction due to noise generation can be reduced.

The effects according to the present disclosure are not limited to the contents exemplified above, and more various effects are included in the present specification.

DETAILED DESCRIPTION

Advantages and characteristics of the present disclosure and a method of achieving the advantages and characteristics are described with respect to exemplary embodiments described below in detail together with the accompanying drawings. However, the present disclosure is not limited to the exemplary embodiments disclosed herein and can be implemented in various forms. The exemplary embodiments are provided by way of example so that those skilled in the art can fully understand the disclosures of the present disclosure and the scope of the present disclosure. Therefore, the present disclosure will be defined by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, one or more other elements or layers may be disposed directly on the other element or interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 1:
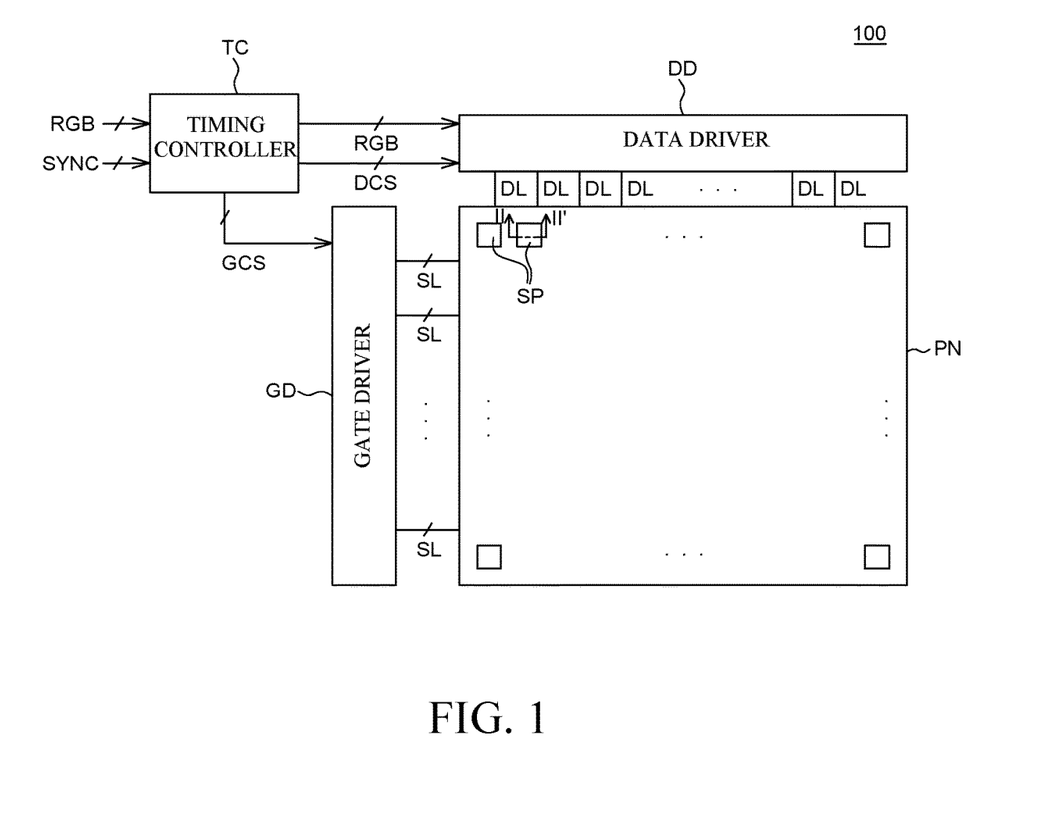
FIG. 1 is a schematic configuration diagram of a display device according to an exemplary embodiment of the present disclosure.

FIG. 1 is a schematic configuration diagram of a display device according to an exemplary embodiment of the present disclosure. In FIG. 1, only a display panel PN, a gate driver GD, a data driver DD, and a timing controller TC among various components of a display device 100 are illustrated for convenience of explanation.

Referring to FIG. 1, the display device 100 includes the display panel PN including a plurality of sub-pixels SP, and the gate driver GD and the data driver DD for supplying various signals to the display panel PN, and the timing controller TC for controlling the gate driver GD and the data driver DD.

The gate driver GD supplies a plurality of scan signals to a plurality of scan lines SL according to a plurality of gate control signals GCS provided from the timing controller TC. Although it is illustrated in FIG. 1 that the gate driver GD is disposed to be spaced apart from one side of the display panel PN, the gate driver GD may be disposed in a gate in panel (GIP) manner, and the number and arrangement of gate drivers GD are not limited thereto.

The data driver DD converts image data RGB input from the timing controller TC into a data signal using a reference gamma voltage according to a plurality of data control signals DCS provided from the timing controller TC. In addition, the data driver DD may supply the converted data signal to a plurality of data lines DL.

The timing controller TC aligns image data RGB input from the outside and supplies it to the data driver DD. The timing controller TC may generate the gate control signals GCS and the data control signals DCS using synchronization signals SYNC that are input from the outside, for example, a dot clock signal, a data enable signal, and a horizontal/vertical synchronization signal. In addition, the timing controller TC may supply the generated gate control signals GCS and data control signals DCS to the gate driver GD and the data driver DD, respectively, to thereby control the gate driver GD and the data driver DD.

The display panel PN is a component to display an image to a user and includes the plurality of sub-pixels SP. The plurality of scan lines SL and the plurality of data lines DL cross each other in the display panel PN, and each of the plurality of sub-pixels SP is connected to the scan line SL and the data line DL.

Figure 2:
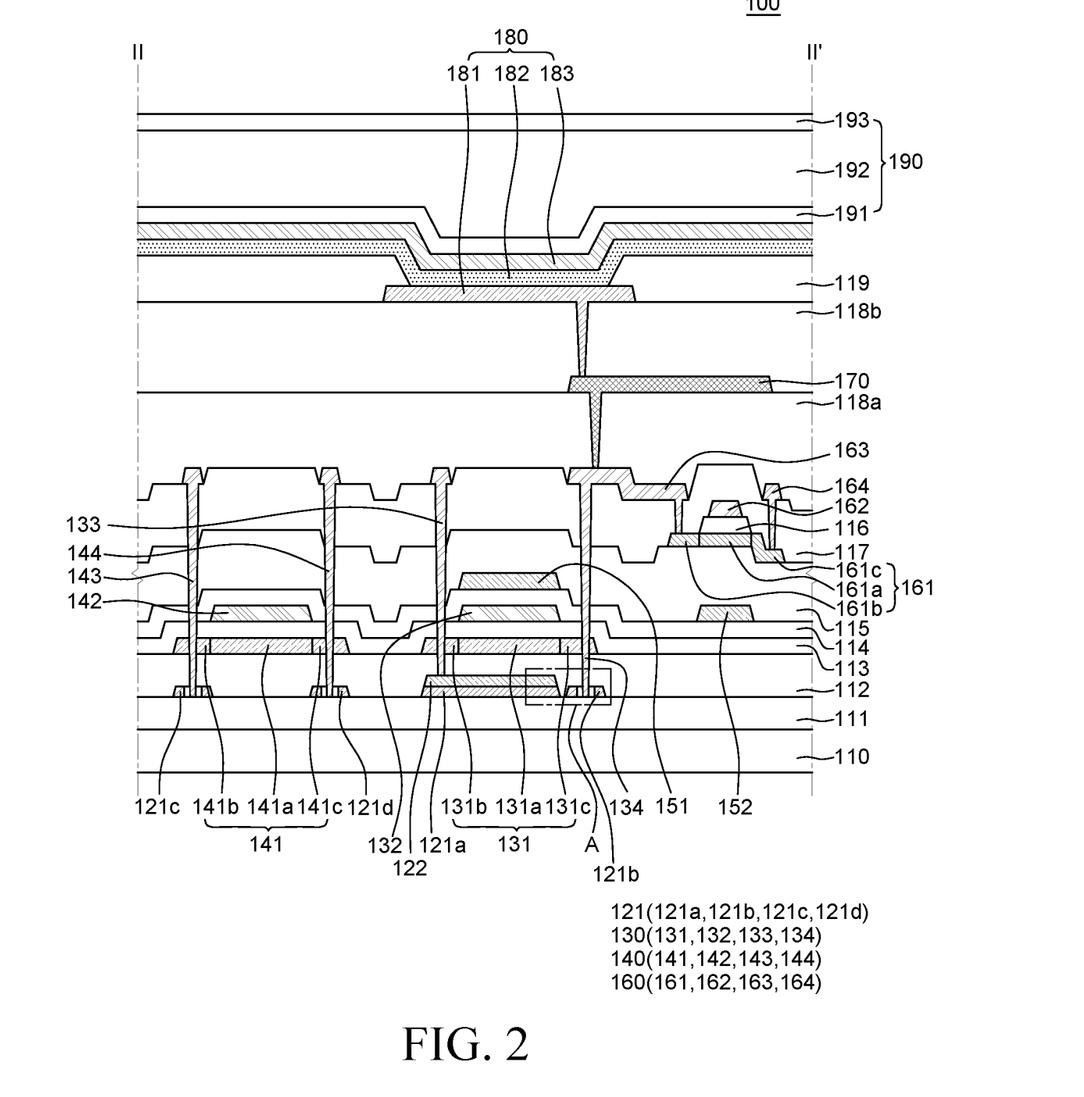
FIG. 2 is a cross-sectional view taken along line II-II' of FIG. 1, according to an exemplary embodiment of the present disclosure.

The plurality of sub-pixels SP are individual units emitting light, and each of the plurality of sub-pixels SP includes a light emitting element 180 (as shown in FIG. 2) and a pixel circuit for driving the light emitting element. The plurality of sub-pixels SP may include a red sub-pixel, a green sub-pixel, a blue sub-pixel, and a white sub-pixel, but is not limited thereto.

A plurality of the light emitting elements may be defined differently depending on a type of the display panel PN. For example, when the display panel PN is an organic light emitting display panel, the light emitting element is an organic light emitting element including an anode, an organic layer, and a cathode. In addition to this, a quantum dot light emitting diode (QLED) including quantum dots (QD) may be further used as the light emitting element. Hereinafter, it is described assuming that the light emitting element is an organic light emitting element, but a type of the light emitting element is not limited thereto.

The pixel circuit is a circuit for controlling driving of the light emitting element. The pixel circuit may include a plurality of transistors and a capacitor. For example, the pixel circuit may include, but is not limited to, a driving transistor, a switching transistor, a sensing transistor, a storage capacitor, and the like.

Hereinafter, the sub-pixel SP of the display device 100 according to an exemplary embodiment of the present disclosure will be described in more detail with reference to FIG. 2.

FIG. 2 is a cross-sectional view taken along line II-II' of FIG. 1, according to an exemplary embodiment of the present disclosure.

Referring to FIG. 2, the display device 100 includes a substrate 110, etch stoppers 121, a passivation layer 122, a first transistor 130, a second transistor 140, a capacitor electrode 151, an auxiliary electrode 152, a third transistor 160, a connection electrode 170, and the light emitting element 180. In addition, the display device 100 includes a first buffer layer 111, a second buffer layer 112, a first gate insulating layer 113, a first interlayer insulating layer 114, a third buffer layer 115, a second gate insulating layer 116, a second interlayer insulating layer 117, a first planarization layer 118a, a second planarization layer 118b, a bank 119, and an encapsulation unit 190.

In addition, in the display device 100 according to an exemplary embodiment of the present disclosure, at least two types of thin film transistors are formed on the same substrate 110. Here, a low temperature poly-silicon (LIPS) thin film transistor using a polysilicon material as an active layer and an oxide semiconductor thin film transistor using a metal oxide as an active layer are used as examples of at least two types of thin film transistors. The display device 100 according to the present disclosure can provide an optimal function by disposing the LPTS thin film transistor and the oxide semiconductor thin film transistor having different properties on the same substrate 100.

For example, the first transistor 130 and the second transistor 140 may be LIPS thin film transistors. The LIPS thin film transistor may be a thin film transistor using low temperature poly-silicon (LIPS) as an active layer. Since a polysilicon material has low energy consumption and excellent reliability due to high mobility (100 cm'/Vs or more), it can be applied to a multiplexer MUX and/or a gate driver for driving elements that drive thin film transistors for display elements. In addition, the polysilicon material is preferably applied as a driving thin film transistor in a pixel in the display device 100.

The third transistor 160 may be an oxide semiconductor thin film transistor. The oxide semiconductor thin film transistor may be a thin film transistor using an oxide semiconductor material as an active layer. Since the oxide semiconductor material has a bandgap greater than that of a silicon material, electrons do not pass the bandgap in an off state and thus, an off-current is low. Accordingly, the oxide semiconductor thin film transistor is suitable for a switching thin film transistor having a short on-time and a long off-time. In addition, since the off-current is small, a size of an auxiliary capacitor can be reduced, so the oxide semiconductor thin film transistor is suitable for a high-resolution display device.

The substrate 110 may support various components of the display device 100. The substrate 110 may be formed of glass or a plastic material having flexibility. When the substrate 110 is formed of a plastic material, it may be formed of, for example, polyimide (PI). When the substrate 110 is formed of polyimide, a manufacturing process of the display device is conducted in a situation in which the support substrate formed of glass is disposed under the substrate 110. After the manufacturing process is completed, the support substrate may be released. Also, after the support substrate is released, a back plate for supporting the substrate 110 may be disposed under the substrate 110.

The first buffer layer 111 may be disposed on the substrate 110. The first buffer layer 111 may be referred to as a multi-buffer layer. The first buffer layer 111 may reduce penetration of moisture or impurities through the substrate 110. Also, the first buffer layer 111 may protect the transistors 130, 140, and 160 from impurities such as alkali ions leaking from the substrate 110. In addition, the first buffer layer 111 may improve adhesion between layers formed thereon and the substrate 110. The first buffer layer 111 may be formed of a single layer of silicon nitride (SiNx) or silicon oxide (SiOx) or multiple layers thereof, but is not limited thereto.

The etch stoppers 121 may be disposed on the first buffer layer 111. The etch stoppers 121 may be selectively formed only in necessary regions on the first buffer layer 111. For example, the etch stoppers 121 may be disposed to correspond to the source electrodes 133 and 143 and the drain electrodes 134 and 144 of the first transistor 130 and the second transistor 140.

For example, the etch stoppers 121 may include a first etch stopper 121a, a second etch stopper 121b, a third etch stopper 121c, and a fourth etch stopper 121d. The first etch stopper 121a may be disposed to overlap a first source electrode 133 and a first channel region 131a of a first active layer 131 of the first transistor 130. The second etch stopper 121b may be disposed to overlap a first drain electrode 134 of the first transistor 130. The third etch stopper 121c may be disposed to overlap the second source electrode 143 of the second transistor 140. The fourth etch stopper 121d may be disposed to overlap the second drain electrode 144 of the second transistor 140.

The etch stoppers 121 may be configured to stop etching in forming contact holes in which the source electrodes 133 and 143 and the drain electrodes 134 and 144 are formed. For example, the etch stoppers 121 may serve as barriers so that the contact holes are not formed up to the first buffer layer 111. Accordingly, damage to the first buffer layer 111 may be prevented, and penetration of moisture or impurities may be reduced. Also, the etch stoppers 121 may be spaced apart from the source electrodes 133 and 143 and the drain electrodes 134 and 144. For example, the etch stoppers 121 may be electrically insulated from the source electrodes 133 and 143 and the drain electrodes 134 and 144. Accordingly, it is possible to prevent generation of noise in the transistors 130 and 140 by the etch stoppers 121. This will be described later.

The etch stoppers 121 may be formed of an oxide semiconductor. For example, the etch stoppers 121 may include at least one of indium gallium zinc oxide (IGZO), indium zinc oxide (IZO), indium gallium oxide (IGO), indium tin zinc oxide (ITZO), and indium tin gallium zinc oxide (ITGZO).

The passivation layer 122 may be disposed on the first etch stopper 121a. The passivation layer 122 may be formed of a metallic material and may be electrically connected to the first source electrode 133 of the first transistor 130. For example, the passivation layer 122 may be formed of molybdenum (Mo), but is not limited thereto. The passivation layer 122 may be selectively formed only in a necessary region. For example, the passivation layer 122 may be disposed to overlap the first transistor 130 that is a driving transistor. In this case, the first active layer 131 of the first transistor 130 may include LTPS, and the passivation layer 122 may be disposed to overlap the first channel region 131a of the first active layer 131. Accordingly, the passivation layer 122 may block a generation of a potential on a surface of the substrate 110 and light entering from the outside.

For example, when the substrate 110 is formed of a plastic material, a separate support substrate is attached to a lower portion of the substrate 110 to support the substrate 110 during a manufacturing process. In this case, a sacrificial layer is disposed between the substrate 110 and the support substrate. When the manufacturing process is completed, the substrate 110 and the support substrate may be separated through a laser release process. The first active layer 131 of the first transistor 130 disposed on the substrate 110 may be damaged by a laser irradiated during the laser release process.

In addition, a sensor using infrared light may be disposed under the display device 100. Accordingly, deterioration of the first active layer 131 may occur due to the light generated from the sensor.

Also, a threshold voltage Vth of the first transistor 130 may be shifted due to a current drop phenomenon caused by the substrate 110 and the sacrificial layer. For example, a negative charge trap may occur in the sacrificial layer by the laser and light introduced from the outside. In addition, positive charges may move toward the sacrificial layer in a plastic material constituting the substrate 110, for example, polyimide (PI). Accordingly, the potential of the surface of the substrate 110 may increase. As a result, the threshold voltage of the first transistor 130 is shifted in a positive direction, and a current flowing through the first transistor 130 may be reduced. The shift of the threshold voltage degrades reliability of the display device 100.

In addition, when the display device 100 is driven after the laser release process is performed, heat may be generated in the substrate 110. As a result, charged particles generated in the substrate 110 move upwardly. The charged particles may affect the first active layer 131 of the first transistor 130 and reduce reliability of the display device 100.

Accordingly, the passivation layer 122 may be disposed below the first transistor 130. In this case, the passivation layer 122 may overlap the first active layer 131, and for example, the passivation layer 122 may be disposed to overlap the first channel region 131a. The passivation layer 122 may prevent deterioration of first channel region 131a due to irradiation of light. In addition, the passivation layer 122 may protect the first transistor 130 from the charged particles generated in the substrate 110, and may reduce or minimize an influence of charges flowing through a channel of the first transistor 130. Accordingly, a phenomenon in which the threshold voltage of the first transistor 130 is shifted, and the current drop phenomenon may be reduced and reliability of the display device 100 may be improved.

Since the passivation layer 122 is formed of a metallic material, the passivation layer 122 and the first active layer 131 also become elements that form capacitance. In this case, when the passivation layer 122 is electrically floating, a change in parasitic capacitance may appear, and a shift amount of the threshold voltage of the first transistor 130 may be varied. This can cause visual defects such as luminance changes. Accordingly, by electrically connecting the passivation layer 122 and the first source electrode 133, parasitic capacitance may be constantly maintained. For example, the same voltage as that of the first source electrode 133 may be applied to the passivation layer 122. However, the present disclosure is not limited thereto, and the passivation layer 122 may also be electrically connected to the first drain electrode 134.

In addition, in the drawings, it is illustrated that the passivation layer 122 is disposed only below the first transistor 130, which is a driving transistor. However, the present disclosure is not limited thereto, and the passivation layer 122 may also be disposed below the second transistor 140. Also, when the second transistor 140 is configured as a driving transistor and the first transistor 130 is configured as a switching transistor, the passivation layer 122 may be disposed only below the second transistor 140, which is the driving transistor.

The second buffer layer 112 may be disposed on the first buffer layer 111, the etch stoppers 121, and the passivation layer 122. The second buffer layer 112 may be referred to as an active buffer layer. The second buffer layer 112 may protect the active layers 131 and 141 of the first transistor 130 and the second transistor 140. The second buffer layer 112 may block various types of defects introduced from the substrate 110. The contact holes in which the source electrodes 133 and 143 and the drain electrodes 134 and 144 are disposed may be formed in the second buffer layer 112. The second buffer layer 112 may be formed of a single layer of silicon nitride (SiNx) or silicon oxide (SiOx) or multiple layers thereof, but is not limited thereto.

The first transistor 130 and the second transistor 140 may be disposed on the second buffer layer 112. The first transistor 130 and the second transistor 140 may be LTPS thin film transistors. Since the LTPS thin film transistor has good response characteristics, it can be used as a driving transistor in a pixel circuit. For example, one of the first transistor 130 and the second transistor 140 may be a driving transistor. Hereinafter, descriptions will be made on the basis that the first transistor 130 is a driving transistor and the second transistor 140 is a switching transistor. However, the present disclosure is not limited thereto, and it may be configured such that the first transistor 130 may be a switching transistor and the second transistor 140 may be a driving transistor.

The first transistor 130 may include the first active layer 131, a first gate electrode 132, the first source electrode 133, and the first drain electrode 134. The second transistor 140 may include a second active layer 141, a second gate electrode 142, a second source electrode 143, and a second drain electrode 144. Alternatively, depending on a design of the pixel circuit, the source electrodes 133 and 143 may be configured as drain electrodes, and the drain electrodes 134 and 144 may be configured as source electrodes.

The first active layer 131 may be disposed on the second buffer layer 112. The first active layer 131 includes the first channel region 131a in which a channel is formed when the first transistor 130 is driven, and a first source region 131b and a first drain region 131c on both sides of the first channel region 131a. The first channel region 131a may overlap the passivation layer 122. In addition, the first source region 131b may be a portion of the first active layer 131 connected to the first source electrode 133, and the first drain region 131c may be a portion of the first active layer 131 connected to the first drain electrode 134.

The first active layer 131 may include low temperature poly-silicon (LTPS). After depositing an amorphous silicon (a-Si) material on the second buffer layer 112 and performing a dehydrogenation process and a crystallization process to thereby form polysilicon, the first active layer 131 may be formed by patterning the polysilicon. The first source region 131b and the first drain region 131c may be formed by ion-doping (impurity doping) of the first active layer 131. For example, the first source region 131b and the first drain region 131c may be portions in which a polysilicon material is ion-doped, and the first channel region 131a may be a portion in which the polysilicon material is not ion-doped and left as the polysilicon material.

The second active layer 141 may be disposed on the second buffer layer 112. The second active layer 141 may include a second channel region 141a, a second source region 141b, and a second drain region 141c. The second active layer 141 may be formed in the same or similar manner as the first active layer 131.

The first gate insulating layer 113 may be disposed on the second buffer layer 112 and the first active layer 131. The contact holes for respectively connecting the source electrodes 133 and 143 and the drain electrodes 134 and 144 to the source regions 131b and 141b and the drain regions 131c and 141c, may be formed in the first gate insulating layer 113. The first gate insulating layer 113 may be formed of a single layer of silicon nitride (SiNx) or silicon oxide (SiOx) or multiple layers thereof, but is not limited thereto.

The first gate electrode 132 and the second gate electrode 142 may be disposed on the first gate insulating layer 113. The first gate electrode 132 may be disposed to overlap the first channel region 131a. The second gate electrode 142 may be disposed to overlap the second channel region 141a. In addition, since the first channel region 131a overlaps the first gate electrode 132, the first etch stopper 121a and the passivation layer 122 may overlap the first gate electrode 132. The first gate electrode 132 and the second gate electrode 142 may be formed as a single layer or multiple layers formed of molybdenum (Mo), copper (Cu), titanium (Ti), aluminum (Al), chromium (Cr), gold (Au), nickel (Ni), and neodymium (Nd), or an alloy thereof.

The first interlayer insulating layer 114 may be disposed on the first gate insulating layer 113, the first gate electrode 132, and the second gate electrode 142. The contact holes for respectively connecting the source electrodes 133 and 143 and the drain electrodes 134 and 144 to the source regions 131b and 141b and the drain regions 131c and 141c, may be formed in the first interlayer insulating layer 114. The first interlayer insulating layer 114 may be formed of a single layer of silicon nitride (SiNx) or silicon oxide (SiOx) or multiple layers thereof, but is not limited thereto.

The capacitor electrode 151 may be disposed on the first interlayer insulating layer 114. The capacitor electrode 151 may be disposed to overlap the first gate electrode 132. The capacitor electrode 151 may form a storage capacitor together with the first gate electrode 132. The capacitor electrode 151 may be formed as a single layer or multiple layers formed of molybdenum (Mo), copper (Cu), titanium (Ti), aluminum (Al), chromium (Cr), gold (Au), nickel (Ni), and neodymium (Nd), or an alloy thereof.

The auxiliary electrode 152 may be disposed on the first interlayer insulating layer 114. The auxiliary electrode 152 may be formed of the same material by the same process as the capacitor electrode 151. The auxiliary electrode 152 may be disposed to overlap a third channel region 161a of a third active layer 161 of the third transistor 160 to be described later. Accordingly, the auxiliary electrode 152 may be a second gate electrode of the third transistor 160. Also, the auxiliary electrode 152 may serve to shield external light incident to the third channel region 161a of the third transistor 160. Accordingly, the auxiliary electrode 152 may protect the third transistor 160 while improving characteristics of the third transistor 160.

The third buffer layer 115 may be disposed on the first interlayer insulating layer 114, the capacitor electrode 151, and the auxiliary electrode 152. The third buffer layer 115 may be referred to as an oxide buffer layer. The third buffer layer 115 may be a buffer layer for protecting the third active layer 161 of the third transistor 160. In addition, the contact holes for respectively connecting the source electrodes 133 and 143 and the drain electrodes 134 and 144 of the first transistor 130 and the second transistor 140 to the source regions 131b and 141b and the drain regions 131c and 141c, may be formed in the third buffer layer 115. The third buffer layer 115 may be formed of a single layer of silicon nitride (SiNx) or silicon oxide (SiOx) or multiple layers thereof, but is not limited thereto.

The third transistor 160 may be disposed on the third buffer layer 115. The third transistor 160 may be an oxide semiconductor thin film transistor. Since the oxide semiconductor thin film transistor has good off-current characteristics, it can be used as a switching transistor in a pixel circuit.

The third transistor 160 may include the third active layer 161, a third gate electrode 162, a third source electrode 163, and a third drain electrode 164. In this case, the third source electrode 163 of the third transistor 160 may be electrically connected to the first drain electrode 134 of the first transistor 130. Alternatively, depending on the design of the pixel circuit, the third source electrode 163 may be configured as a drain electrode, and the third drain electrode 164 may be configured as a source electrode.

The third active layer 161 may be disposed on the third buffer layer 115. The third active layer 161 may include the third channel region 161a in which a channel is formed when the third transistor 160 is driven, and a third source region 161b and a third drain region 161c on both sides of the third channel region 161a. The third channel region 161a may overlap the auxiliary electrode 152. Also, the third source region 161b may be a portion of the third active layer 161 connected to the third source electrode 163, and the third drain region 161c may be a portion of the third active layer 161 connected to the third drain electrode 164.

The third active layer 161 may include an oxide semiconductor. For example, the third active layer 161 is formed of a metal oxide, and specifically, may include a metal oxide such as indium gallium zinc oxide (IGZO), indium zinc oxide (IZO), indium gallium tin oxide (IGTO) or indium gallium oxide (IGO). The third active layer 161 may be formed by depositing a metal oxide on the third buffer layer 115, performing a heat treatment process for stabilization, and then patterning the metal oxide. The third source region 161b and the third drain region 161c may be formed by conducting the third active layer 161. For example, the third source region 161b and the third drain region 161c may be portions where a metal oxide is conductive, and the third channel region 161a may be a portion where a metal oxide is not conductive. As resistance of the third source region 161b and the third drain region 161c that are conductive is lowered, element performance of the third transistor 160 may be improved. Accordingly, reliability of the display device 100 may be improved.

The second gate insulating layer 116 may be disposed on the third active layer 161. The second gate insulating layer 116 may be disposed to overlap the third channel region 161a of the third active layer 161. For example, the second gate insulating layer 116 may be disposed only in a region corresponding to the third channel region 161a, but is not limited thereto. The second gate insulating layer 116 may be formed of a single layer of silicon nitride (SiNx) or silicon oxide (SiOx) or multiple layers thereof, but is not limited thereto.

The third gate electrode 162 may be disposed on the second gate insulating layer 116. The third gate electrode 162 may be disposed to overlap the third channel region 161a. The third gate electrode 162 may be formed as a single layer or multiple layers formed of molybdenum (Mo), copper (Cu), titanium (Ti), aluminum (Al), chromium (Cr), gold (Au), nickel (Ni), and neodymium (Nd), or an alloy thereof.

The second interlayer insulating layer 117 may be disposed on the third buffer layer 115, the third active layer 161, the second gate insulating layer 116, and the third gate electrode 162. Contact holes for respectively connecting the source electrodes 133, 143, 163 and the drain electrodes 134, 144, and 164 to the source regions 131b, 141b and 161b and the drain regions 131c, 141c and 161c may be formed in the second interlayer insulating layer 117. The second interlayer insulating layer 117 may be formed of a single layer of silicon nitride (SiNx) or silicon oxide (SiOx) or multiple layers thereof, but is not limited thereto.

The source electrodes 133, 143, and 163 and the drain electrodes 134, 144, and 164 may be disposed on the second interlayer insulating layer 117. The source electrodes 133, 143, 163 and the drain electrodes 134, 144, and 164 may be formed of the same material by the same process. The source electrodes 133, 143, 163 and the drain electrodes 134, 144, and 164 may be formed as single layers or multiple layers formed of molybdenum (Mo), copper (Cu), titanium (Ti), aluminum (Al), chromium (Cr), gold (Au), nickel (Ni), and neodymium (Nd), or an alloy thereof.

For example, the first source electrode 133 and the first drain electrode 134 of the first transistor 130 may be connected to the first active layer 131 through the contact holes formed in the first gate insulating layer 113, the first interlayer insulating layer 114, the third buffer layer 115 and the second interlayer insulating layer 117. For example, the first source electrode 133 may be connected to the first source region 131b of the first active layer 131 through the contact hole. Also, the first drain electrode 134 may be connected to the first drain region 131c of the first active layer 131 through the contact hole.

The first source electrode 133 and the first drain electrode 134 may be disposed to extend to the second buffer layer 112 under the first active layer 131. For example, the contact holes formed in the first gate insulating layer 113, the first interlayer insulating layer 114, the third buffer layer 115, and the second interlayer insulating layer 117 may be formed to extend to the first active layer 131 and the second buffer layer 112. The first source electrode 133 may be electrically connected to the passivation layer 122 through the contact hole of the second buffer layer 112. The first drain electrode 134 may extend to contact the first buffer layer 111 through the contact hole of the second buffer layer 112 and a hole of the second etch stopper 121b to be described later. In addition, although it is illustrated that the contact hole of the first source electrode 133 is formed only up to an upper surface of the passivation layer 122 in the drawings, the present disclosure is not limited thereto, and the contact hole may also be formed in the passivation layer 122.

The second source electrode 143 and the second drain electrode 144 of the second transistor 140 may be connected to the second active layer 141 through the contact holes formed in the first gate insulating layer 113, the first interlayer insulating layer 114, the third buffer layer 115, and the second interlayer insulating layer 117. For example, the second source electrode 143 may be connected to the second source region 141b of the second active layer 141 through the contact hole. Also, the second drain electrode 144 may be connected to the second drain region 141c of the second active layer 141 through the contact hole.

The second source electrode 143 and the second drain electrode 144 may be disposed to extend to the second buffer layer 112 below the second active layer 141. For example, the contact holes formed in the first gate insulating layer 113, the first interlayer insulating layer 114, the third buffer layer 115, and the second interlayer insulating layer 117 may be formed to extend to the second active layer 141 and the second buffer layer 112. The second source electrode 143 and the second drain electrode 144 may extend to contact the first buffer layer 111 through the contact holes of the second buffer layer 112 and holes of the third etch stopper 121c and the fourth etch stopper 121d.

The third source electrode 163 and the third drain electrode 164 of the third transistor 160 may be connected to the third active layer 161 through the contact holes formed in the second interlayer insulating layer 117. For example, the third source electrode 163 may be connected to the third source region 161b of the third active layer 161 through the contact hole. Also, the third drain electrode 164 may be connected to the third drain region 161c of the third active layer 161 through the contact hole. Here, the contact holes may mean holes through which the third source electrode 163 and the third drain electrode 164 are disposed in the second interlayer insulating layer 117.

The contact holes formed in the first gate insulating layer 113, the first interlayer insulating layer 114, the third buffer layer 115, and the second interlayer insulating layer 117 may be formed to extend to the second buffer layer 112. For example, the first source electrode 133 and the first drain electrode 134 of the first transistor 130 may extend to the second buffer layer 112 disposed below the first active layer 131. Also, the second source electrode 143 and the second drain electrode 144 of the second transistor 140 may extend to the second buffer layer 112 disposed below the second active layer 141. In this case, the source electrodes 133 and 143 and the drain electrodes 134 and 144 may overlap the etch stoppers 121 disposed in a lower portion of the second buffer layer 112. Etching may be stopped by the etch stoppers 121 in forming the contact holes. Accordingly, the first buffer layer 111 under the etch stoppers 121 may be prevented from being etched, and reliability of the display device 100 may be improved.

Under a driving transistor, a passivation layer for protecting the driving transistor may be disposed. In this case, the passivation layer may be electrically connected to a source electrode or a drain electrode of the driving transistor to maintain a constant parasitic capacitance. In addition, in forming contact holes of the source electrode and the drain electrode, the contact holes may be formed up to an upper portion of the passivation layer in order to reduce or minimize the number of masks. For example, contact holes for contacting the source electrode and the drain electrode and an active layer and a contact hole for contacting the source electrode or the drain electrode and the passivation layer may be formed through a single etching process. In addition, in order to simplify the process, a contact hole etching process may be performed simultaneously in all transistors.

Accordingly, in a transistor in which the passivation layer is not disposed, etching may be conducted up to a multi-buffer layer adjacent to a substrate or the substrate. In addition, even if the passivation layer is disposed, over-etching may be conducted up to the passivation layer and the multi-buffer layer or the substrate thereunder. When the multi-buffer layer and the substrate are damaged by the etching, moisture may penetrate from the outside therein and cause a defect in a display device.

Accordingly, in the display device 100 according to an exemplary embodiment of the present disclosure, the etch stoppers 121 may be disposed in regions corresponding to the source electrodes 133 and 143 and the drain electrodes 134 and 144. The etch stoppers 121 may be disposed on the first buffer layer 111 to overlap the source electrodes 133 and 143 and the drain electrodes 134 and 144. In this case, the etch stoppers 121 may include an oxide semiconductor. For example, the etch stoppers 121 may be formed of a material having an etch selectivity different from those of the second buffer layer 112, the first gate insulating layer 113, the first interlayer insulating layer 114, the third buffer layer 115, and the second interlayer insulating layer 117 thereover. Accordingly, in forming the contact holes, etching is performed only until the etch stoppers 121 are exposed, and etching is not performed on lower portions of the etch stoppers 121. Accordingly, damage to the first buffer layer 111 and the substrate 110 may be prevented, and penetration of moisture and impurities from the outside may be prevented.

In addition, although it is shown in FIG. 2 that the passivation layer 122 is directly disposed on the first etch stopper 121a, but embodiments of the present disclosure is not limited thereto. For example, another buffer layer or insulating layer may be interposed between the passivation layer 122 and the etch stopper 121. In this case, the first etch stopper 121a may be disposed to only overlap the first source region 131b, and may not overlap the first channel region 131a, which is similar to the second etch stopper 121b.

In addition, in the case of the third transistor 160, the third active layer 161 may be formed of an oxide semiconductor. For example, in forming the contact hole, the third active layer 161 may act as an etch stopper. Accordingly, a separate etch stopper may not be disposed under the third transistor 160.

A buffered oxide etch (BOE) treatment may be performed between a contact hole forming process and a process of forming the source electrodes 133, 143, 163 and the drain electrodes 134, 144, and 164. Holes may be formed in the etch stoppers 121 by the BOE treatment, and the etch stoppers 121 may be spaced apart from the source electrodes 133 and 143 and the drain electrodes 134 and 144 by the holes. This will be described later with reference to FIG. 3.

The first planarization layer 118a may be disposed on the second interlayer insulating layer 117, the source electrodes 133, 143, and 163, and the drain electrodes 134, 144, and 164. The first planarization layer 118a may include a contact hole for exposing the first drain electrode 134 or the third source electrode 163. The first planarization layer 118a may be an organic material layer for planarizing and protecting upper portions of the transistors 130, 140, and 160. For example, the first planarization layer 118a may be formed of an organic material such as an acrylic resin, an epoxy resin, a phenolic resin, a polyamide resin, a polyimide resin, or the like, but is not limited thereto.

The connection electrode 170 may be disposed on the first planarization layer 118a. The connection electrode 170 may serve to electrically connect the light emitting element 180 and the first transistor 130 or the third transistor 160. For example, the connection electrode 170 may connect a first electrode 181 and the first drain electrode 134 or the third source electrode 163 through the contact hole of the first planarization layer 118a. The connection electrode 170 may be formed as a single layer or multiple layers formed of molybdenum (Mo), copper (Cu), titanium (Ti), aluminum (Al), chromium (Cr), gold (Au), nickel (Ni), and neodymium (Nd), or an alloy thereof.

The second planarization layer 118b may be disposed on the first planarization layer 118a and the connection electrode 170. The second planarization layer 118b may include a contact hole for exposing the connection electrode 170. The second planarization layer 118b may be formed of an organic material such as an acrylic resin, an epoxy resin, a phenolic resin, a polyamide resin, or a polyimide resin, but is not limited thereto.

The light emitting element 180 may be disposed on the second planarization layer 118b. The light emitting element 180 may include the first electrode 181, a light emitting layer 182, and a second electrode 183. Here, the first electrode 181 may be an anode electrode, and the second electrode 183 may be a cathode electrode.

In addition, the display device 100 may be implemented in a top emission method or a bottom emission method. In the case of the top emission method, a reflective layer for reflecting light that is emitted from the light emitting layer 182 toward the second electrode 183 may be disposed under the first electrode 181. For example, the reflective layer may include a material having excellent reflectivity, such as aluminum (Al) or silver (Ag), but is not limited thereto. On the other hand, in the case of the bottom emission method, the first electrode 181 may be formed of only a transparent conductive material. Hereinafter, it is described assuming that the display device 100 according to an exemplary embodiment of the present disclosure is in the top emission method.

The first electrode 181 may be disposed on the second planarization layer 118b. The first electrode 181 may be electrically connected to the connection electrode 170 through the contact hole formed in the second planarization layer 118b. Also, the first electrode 181 may be connected to the first drain electrode 134 of the first transistor 130 and the third source electrode 163 of the third transistor 160 through the connection electrode 170.

The first electrode 181 may be formed in a multilayer structure including a transparent conductive layer and an opaque conductive layer having high reflective efficiency. The transparent conductive layer may be formed of a material having a relatively large work function value, such as indium tin oxide (ITO) or indium zinc oxide (IZO). The opaque conductive layer may have a single layer or multilayer structure including Al, Ag, Cu, Pb, Mo, Ti, or an alloy thereof. However, the material of the first electrode 181 is not limited thereto.

The bank 119 may be disposed on the second planarization layer 118b and the first electrode 181. The bank 119 may be formed on the second planarization layer 118b to cover edges of the first electrode 181. The bank 119 may define a light emitting area of the display device 100 and thus may be referred to as a pixel defining layer. The bank 119 may be an organic insulating material. For example, the bank 119 may be formed of polyimide, acrylic, or benzocyclobutene (BCB)-based resin, but is not limited thereto.

The light emitting layer 182 may be disposed on the first electrode 181 and the bank 119. The light emitting layer 182 may be an organic layer for emitting light of a specific color. For example, the light emitting layer 182 may be one of a red light emitting layer, a green light emitting layer, a blue light emitting layer, and a white light emitting layer. When the light emitting layer 182 is formed of a white light emitting layer, a color filter may be further disposed on the light emitting element 180. The light emitting layer 182 may further include various layers such as a hole transport layer, a hole injection layer, a hole blocking layer, an electron injection layer, an electron blocking layer, an electron transport layer, and the like.

The second electrode 183 may be disposed on the light emitting layer 182. Since the second electrode 183 supplies electrons to the light emitting layer 182, it may be formed of a conductive material having a low work function. The second electrode 183 may be formed of, for example, a transparent conductive material such as indium tin oxide (ITO) or indium zinc oxide (IZO), a metal alloy such as MgAg or an ytterbium (Yb) alloy, or the like, and may further include a metal doped layer, but the present disclosure is not limited thereto.

The encapsulation unit 190 may be disposed on the light emitting element 180. The encapsulation unit 190 protects the light emitting element 180 from moisture penetrating from the outside of the display device 100. The encapsulation unit 190 may include a first encapsulation layer 191, a foreign material cover layer 192, and a second encapsulation layer 193.

The first encapsulation layer 191 may be disposed on the second electrode 183 and suppress penetration of moisture or oxygen. The first encapsulation layer 191 may be formed of an inorganic material such as silicon nitride (SiNx), silicon oxynitride (SiNxOy), or aluminum oxide (AlyOz), but is not limited thereto.

The foreign material cover layer 192 may be disposed on the first encapsulation layer 191 and planarizes a surface thereof. Also, the foreign material cover layer 192 may cover foreign materials or particles that may be generated during a manufacturing process. The foreign material cover layer 192 may be formed of an organic material, for example, silicon oxycarbon (SiOxCz), acrylic or epoxy-based resin, but is not limited thereto.

The second encapsulation layer 193 may be disposed on the foreign material cover layer 192, and may suppress penetration of moisture or oxygen, together with the first encapsulation layer 191. In this case, the second encapsulation layer 193 and the first encapsulation layer 191 may be formed to encapsulate the foreign material cover layer 192. Accordingly, moisture or oxygen penetrating into the light emitting element 180 may be more effectively reduced by the second encapsulation layer 193. The second encapsulation layer 193 may be formed of an inorganic material such as silicon oxide (SiOx), silicon nitride (SiNx), silicon oxynitride (SiNxOy), or aluminum oxide (AlyOz), but is not limited thereto.

Figure 3:
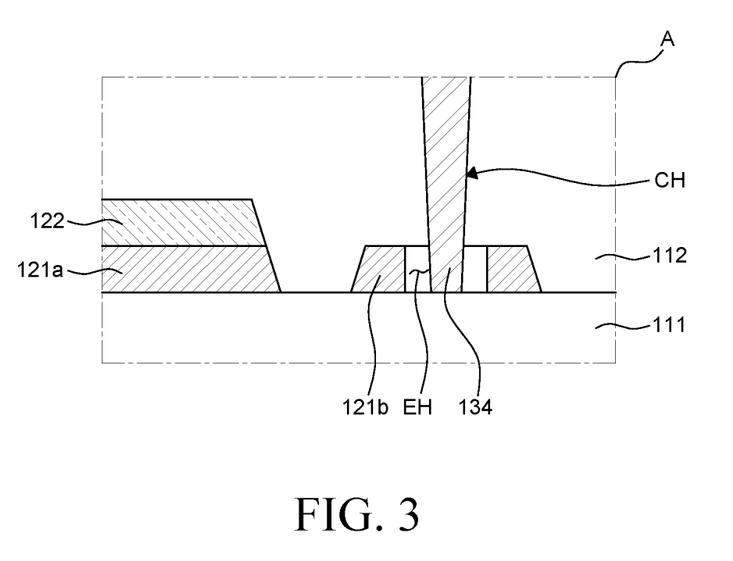
FIG. 3 is an enlarged view of area A of FIG. 2, according to an exemplary embodiment of the present disclosure.

FIG. 3 is an enlarged view of area A of FIG. 2, according to an exemplary embodiment of the present disclosure.

Referring to FIG. 3, the second etch stopper 121b may include a hole EH. The hole EH may be formed by etching a portion of the second etch stopper 121b under a contact hole CH during a buffered oxide etch (BOE) treatment. The second etch stopper 121b may be spaced apart from the first drain electrode 134 by the hole EH. Accordingly, the second etch stopper 121b may be insulated from the first drain electrode 134. Accordingly, it is possible to prevent generation of noise in the first transistor 130. In addition, although only an enlarged view of the second etch stopper 121b is illustrated in FIG. 3, this structure may be equally applied to the third etch stopper 121c and the fourth etch stopper 121d.

Here, holes EH may mean holes formed in the etch stoppers 121b, 121c, and 121d. In addition, contact holes CH may mean holes through which the source electrodes 133 and 143 and the drain electrodes 134 and 144 are disposed in the second buffer layer 112, the active layers 131 and 141, the first gate insulating layer 113, the first interlayer insulating layer 114, the third buffer layer 115, and the second interlayer insulating layer 117.

In general, a BOE treatment may be performed on a transistor including an active layer formed of LTPS after forming a contact hole. In this case, the BOE treatment may be an etching process for removing an oxide layer. For example, in etching an LTPS active layer, an oxide layer may be formed on an interface between the LTPS active layer and the contact hole. Such an oxide film may increase resistance between the active layer and a source electrode and a drain electrode. Accordingly, the oxide layer may be removed by performing the BOE treatment between a contact hole forming process and a source electrode and drain electrode forming process.

Etching for forming the contact holes CH may be stopped at upper portions of the etch stoppers 121. For example, the second buffer layer 112 is etched to form the contact holes CH, and this etching may be performed until the etch stoppers 121 are exposed. Since the active layers 131 and 141 of the first transistor 130 and the second transistor 140 are formed of LIPS, the BOE treatment may be performed after the contact holes CH are formed. In this case, since the etch stoppers 121 are formed of an oxide semiconductor, they may be etched together with oxide layers formed in the contact holes CH of the active layers 131 and 141 during BOE treatment. For example, the etch stoppers 121 that are exposed by the contact holes CH may be etched to form the holes EH. The etch stoppers 121 may be etched up to regions extending from the contact holes CH and peripheral regions thereof. Accordingly, the hole EH may be formed to extend from a region corresponding to the contact hole CH to the lower portion of the second buffer layer 112 that is the peripheral region thereof. Also, the hole EH may be formed to expose the first buffer layer 111.

In addition, although the present disclosure has been described based on that the BOE treatment is performed for etching of the oxide layers of the contact holes and the etch stoppers 121, the present disclosure is not limited thereto. For example, etching using a nitric acid-based or OZA-based etchant may be performed according to a material of the etch stoppers 121.

After the forming of the contact holes CH and the BOE treatment, the source electrodes 133, 143, 163 and the drain electrodes 134, 144, and 164 are formed. Since the contact holes CH are connected to the holes EH, the first drain electrode 134 of the first transistor 130 and the second source electrode 143 and the second drain electrode 144 of the second transistor 140 may also be formed in the holes EH. Also, the first drain electrode 134, the second source electrode 143, and the second drain electrode 144 may be disposed to contact an upper surface of the first buffer layer 111. In this case, the source electrodes 133, 143, and 163 and the drain electrodes 134, 144, and 164 may be deposited by sputtering. Accordingly, the first drain electrode 134, the second source electrode 143, and the second drain electrode 144 may be formed only in regions corresponding to the contact holes CH within the holes EH. For example, the first drain electrode 134, the second source electrode 143, and the second drain electrode 144 are not formed in portions that are covered by the second buffer layer 112 within the holes EH. Accordingly, the source electrodes 133 and 143 and the drain electrodes 134 and 144 of the first transistor 130 and the second transistor 140 may be spaced apart from the etch stoppers 121.

In addition, although it is illustrated that the hole EH is not formed in the first etch stopper 121a in FIG. 2, the present disclosure is not limited thereto. For example, when the contact hole CH in which the first source electrode 133 is formed extends to the passivation layer 122, the hole EH may also be formed under the contact hole at the passivation layer 122.

The first drain electrode 134, the second source electrode 143, and the second drain electrode 144 may be insulated from the etch stoppers 121b, 121c, and 121d by the holes EH. Accordingly, noise generation of the first transistor 130 and the second transistor 140 may be reduced. For example, the first transistor 130, which is a driving transistor, is connected to the light emitting element 180 through the first drain electrode 134. Accordingly, it is possible to prevent the light emitting element 180 from being turned on due to unnecessary noise. Accordingly, operational reliability of the display device 100 may be improved.

Figure 4:
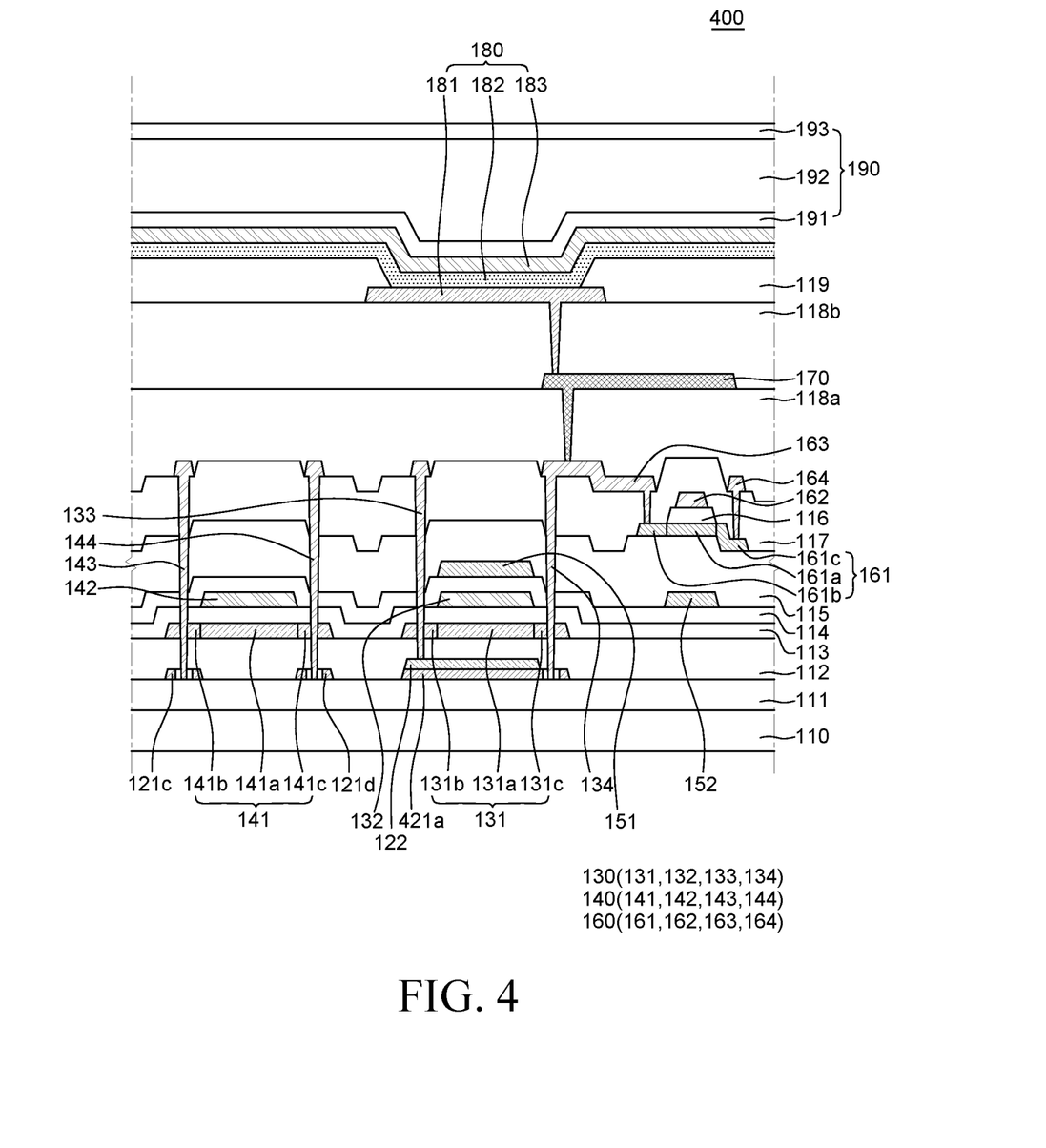
FIG. 4 is a cross-sectional view of a display device according to another exemplary embodiment of the present disclosure.

FIG. 4 is a cross-sectional view of a display device according to another exemplary embodiment of the present disclosure. Compared to the display device 100 of FIG. 2, a display device 400 of FIG. 4 has substantially the same configuration except for a first etch stopper 421a, and thus, a redundant description thereof will be omitted.

Referring to FIG. 4, the first etch stopper 421a may be disposed to overlap the first active layer 131. For example, the first etch stopper 421a may overlap both the first source electrode 133 and the first drain electrode 134. In this case, the first etch stopper 421a may be spaced apart from the first drain electrode 134.

The first etch stopper 421a may be formed of an oxide semiconductor. For example, the first etch stopper 421a may include at least one of indium gallium zinc oxide (IGZO), indium zinc oxide (IZO), indium gallium oxide (IGO), indium tin zinc oxide (ITZO), and Indium Tin Gallium Zinc Oxide (ITGZO).

The first etch stopper 421a may be configured to stop etching in forming the contact hole for a contact between the first drain electrode 134 and the first active layer 131. For example, etching is not performed on the first buffer layer 111 under the first etch stopper 421a. Accordingly, by the first etch stopper 421a, damage to the first buffer layer 111 may be prevented and penetration of moisture or impurities may be reduced. Also, the first etch stopper 421a may include a hole, and the first drain electrode 134 may be spaced apart from the first etch stopper 421a in the hole. Accordingly, it is possible to prevent generation of unnecessary noise. Accordingly, it is possible to prevent an error operation of the first transistor 130 or the light emitting element 180 due to noise, and to improve operational reliability of the display device 400.

The exemplary embodiments of the present disclosure can also be described as follows:

According to an aspect of the present disclosure, a display device includes: a substrate including a plurality of sub-pixels; a first buffer layer on the substrate; an etch stopper on the first buffer layer; a second buffer layer covering the first buffer layer; a first transistor on the second buffer layer, the first transistor including a source electrode and a drain electrode overlapping the etch stopper; and a light emitting element on the transistor. The etch stopper includes a hole in which at least one of the source electrode and the drain electrode is disposed. The etch stopper is spaced apart from the at least one of source electrode and the drain electrode.

At least one of the source electrode and the drain electrode may be disposed to be spaced apart from the etch stopper in the hole of the etch stopper.

The first buffer layer may be exposed by the hole of the etch stopper. At least one of the source electrode and the drain electrode may contact the first buffer layer in the hole.

The etch stopper may include a first etch stopper overlapping the source electrode and a second etch stopper overlapping the drain electrode. The first etch stopper and the second etch stopper may be spaced apart from each other.

The first transistor may further include an active layer connected to the source electrode and the drain electrode. The first etch stopper or the second etch stopper may overlap a channel region of the active layer.

The first transistor may further include an active layer connected to the source electrode and the drain electrode. The etch stopper may overlap a channel region of the active layer.

The display device may further include: a passivation layer disposed on the etch stopper. The first transistor may further include an active layer connected to the source electrode and the drain electrode. The passivation layer may overlap a channel region of the active layer.

At least one of the source electrode and the drain electrode may be electrically connected to the passivation layer.

The etch stopper may include an oxide semiconductor.

An active layer of the first transistor may include low temperature poly-silicon (LTPS).

The display device may further include: a second transistor disposed on the substrate. An active layer of the second transistor may include an oxide semiconductor.

According to another aspect of the present disclosure, a display device includes: a substrate including a plurality of sub-pixels; a multi-buffer layer on the substrate; an etch stopper on the multi-buffer layer and configured to prevent etching of the multi-buffer layer; an active buffer layer covering the multi-buffer layer; a low temperature poly-silicon (LTPS) thin film transistor on the active buffer layer, and including an active layer and a source electrode and a drain electrode connected to the active layer; and a light emitting element on the LTPS thin film transistor. The source electrode and the drain electrode are disposed to overlap the etch stopper. At least one of the source electrode and the drain electrode is disposed to contact an upper surface of the multi-buffer layer and to be spaced apart from the etch stopper.

The etch stopper may include a hole exposing the multi-buffer layer. At least one of the source electrode and the drain electrode may be disposed in the hole.

The display device may further include: a passivation layer on the etch stopper. The passivation layer may overlap a channel region of the active layer.

The passivation layer may be electrically connected to one of the source electrode and the drain electrode.

The etch stopper may overlap a channel region of the active layer.

The etch stopper may include a first etch stopper overlapping the source electrode and a second etch stopper overlapping the drain electrode. The first etch stopper and the second etch stopper may be spaced apart from each other.

The first etch stopper or the second etch stopper may overlap a channel region of the active layer.

The etch stopper may include an oxide semiconductor.

The display device may further include: an oxide semiconductor thin film transistor on the substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate including a plurality of sub-pixels;
a first buffer layer on the substrate;
an etch stopper on the first buffer layer;
a second buffer layer covering the first buffer layer; and
a first transistor on the second buffer layer, the first transistor including a first source electrode, a first drain electrode and a first active layer, wherein the first source electrode and the first drain electrode are overlapping the etch stopper;
an auxiliary electrode on the first transistor;
a second transistor on the auxiliary electrode, the second transistor including a second source electrode, a second drain electrode and a second active layer;
a first planarization layer on the first transistor;
a connection electrode on the first planarization layer, the connection electrode connected to the first drain electrode of the first transistor;
a second planarization layer on the connection electrode; and
a light emitting element on the first transistor, the light emitting element including a first electrode connected to the connection electrode, a light emitting layer and a second electrode,
wherein the etch stopper includes a hole in which at least one of the first source electrode and the first drain electrode is disposed,
wherein the etch stopper is spaced apart from the at least one of the first source electrode and the first drain electrode,
wherein the first active layer includes a low temperature poly-silicon (LTPS), and the second active layer includes an oxide semiconductor,
wherein the first active layer and the second active layer are disposed on different layers, and
wherein the second active layer is overlapping the auxiliary electrode.

2. The display device of claim 1, wherein at least one of the first source electrode and the first drain electrode is disposed to be spaced apart from the etch stopper in the hole of the etch stopper.

3. The display device of claim 1, wherein the first buffer layer is exposed by the hole of the etch stopper, and
wherein at least one of the first source electrode or the first drain electrode contacts the first buffer layer in the hole.

4. The display device of claim 1, wherein the etch stopper includes a first etch stopper overlapping the first source electrode and a second etch stopper overlapping the first drain electrode, and
wherein the first etch stopper and the second etch stopper are spaced apart from each other.

5. The display device of claim 4, wherein the first active layer is connected to the first source electrode and the first drain electrode, and
wherein the first etch stopper or the second etch stopper overlaps a channel region of the first active layer.

6. The display device of claim 1, wherein the first active layer is connected to the first source electrode and the first drain electrode, and
wherein the etch stopper overlaps a channel region of the first active layer.

7. The display device of claim 1, further comprising:
a passivation layer disposed over the etch stopper,
wherein the first active layer is connected to the first source electrode and the first drain electrode, and
wherein the passivation layer overlaps a channel region of the first active layer.

8. The display device of claim 7, wherein at least one of the first source electrode and the first drain electrode is electrically connected to the passivation layer.

9. The display device of claim 1, wherein the etch stopper includes an oxide semiconductor.

10. The display device of claim 1, wherein the first transistor further comprises:
a first gate electrode on the first active layer; and
a capacitor electrode on the first gate electrode.

11. The display device of claim 10, wherein the capacitor electrode is on a same layer as the auxiliary electrode.

12. A display device, comprising:
a substrate including a plurality of sub-pixels;
a multi-buffer layer on the substrate;
an etch stopper on the multi-buffer layer, the etch stopper configured to reduce etching of the multi-buffer layer;
an active buffer layer covering the multi-buffer layer; and
a low temperature poly-silicon (LTPS) thin film transistor on the active buffer layer, the LTPS thin film transistor including a first active layer, a first source electrode, and a first drain electrode, the first source electrode and the first drain electrode connected to the first active layer;
an auxiliary electrode on the LTPS thin film transistor;
an oxide semiconductor thin film transistor on the auxiliary electrode, the oxide semiconductor thin film transistor including a second active layer, a second source electrode, and a second drain electrode, the second source electrode and the second drain electrode connected to the second active layer;
a first planarization layer on the oxide semiconductor thin film transistor;
a connection electrode on the first planarization layer, the connection electrode connected to the first drain electrode;
a second planarization layer on the connection electrode; and
a light emitting element on the LTPS thin film transistor, the light emitting element including a first electrode connected to the connection electrode, a light emitting layer and a second electrode,
wherein the first source electrode and the first drain electrode are disposed to overlap the etch stopper,
wherein at least one of the first source electrode or the first drain electrode is disposed to contact an upper surface of the multi-buffer layer and to be spaced apart from the etch stopper, and
wherein the second active layer overlaps the auxiliary electrode.

13. The display device of claim 12, wherein the etch stopper includes a hole exposing the multi-buffer layer, and
wherein at least one of the first source electrode or the first drain electrode is disposed in the hole.

14. The display device of claim 12, further comprising: a passivation layer over the etch stopper, wherein the passivation layer overlaps a channel region of the first active layer.

15. The display device of claim 14, wherein the passivation layer is electrically connected to one of the first source electrode and the first drain electrode.

16. The display device of claim 12, wherein the etch stopper overlaps a channel region of the first active layer.

17. The display device of claim 12, wherein the etch stopper includes a first etch stopper overlapping the first source electrode and a second etch stopper overlapping the first drain electrode, and wherein the first etch stopper and the second etch stopper are spaced apart from each other.

18. The display device of claim 17, wherein the first etch stopper or the second etch stopper overlaps a channel region of the first active layer.

19. The display device of claim 12, wherein the etch stopper includes an oxide semiconductor.

* * * * *